US006404629B1

(12) United States Patent
Austin et al.

(10) Patent No.: US 6,404,629 B1
(45) Date of Patent: Jun. 11, 2002

(54) CARD SHELF FIRE SUPPRESSION SYSTEM AND METHOD

(75) Inventors: Thomas A. Austin, Occidental; Matthew K. Meeker, Santa Rosa, both of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/622,000

(22) Filed: Jul. 31, 2000

(51) Int. Cl.[7] .................................................. H05K 7/20
(52) U.S. Cl. ..................... 361/690; 169/49; 454/184; 454/369
(58) Field of Search .................. 62/259.2; 236/49.1–49.5; 337/1, 17, 297; 361/688, 690, 694–695; 454/184, 369; 169/44, 56, 59

(56) References Cited

U.S. PATENT DOCUMENTS 6,155,921 A * 12/2000 Evans et al. ................ 454/184

FOREIGN PATENT DOCUMENTS

| JP | 2076299 | * 10/1990 |
| JP | 2547797 | * 10/1990 |

* cited by examiner

Primary Examiner—Gregory Thompson
(74) Attorney, Agent, or Firm—Baker Botts L.L.P.

(57) ABSTRACT

A card shelf fire suppression system includes a card shelf having a backplane and a plurality of slots. The slots are each configured to receive an electronic card adapted for engagement with the backplane. The system also includes an airflow path for providing airflow adjacent the electronic card for dissipating thermal energy generated by the electronic card. The system further includes a damper system disposed proximate the slots and operable to passively activate to substantially prevent airflow through the slots and adjacent the electronic card. The damper system includes a damper, a support, and a thermal fuse. In response to an elevated temperature condition, the thermal fuse deforms causing the damper to become unsupported by the support, thereby accommodating movement of the damper from an open position to a closed position to substantially prevent airflow to the electronic cards.

26 Claims, 2 Drawing Sheets

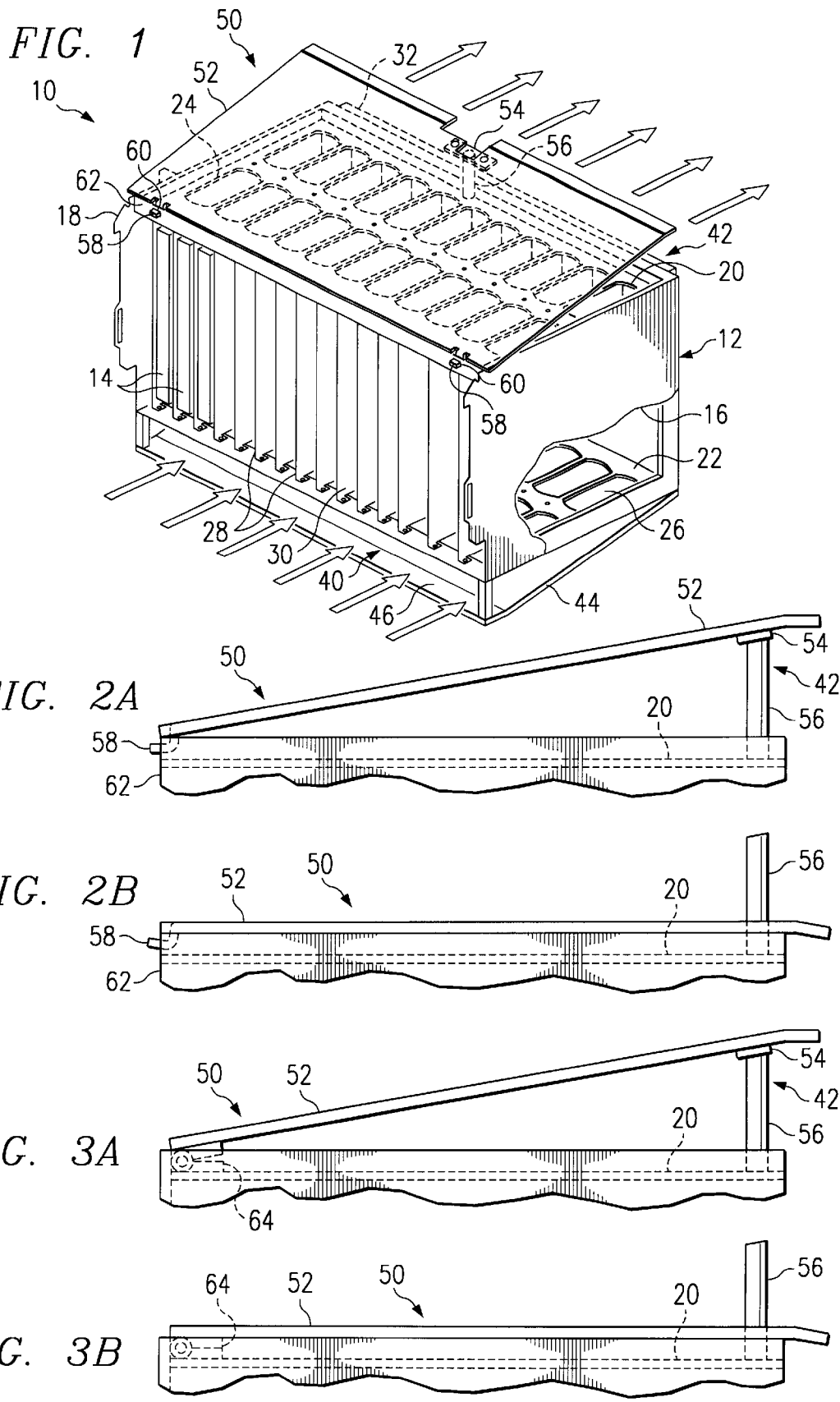

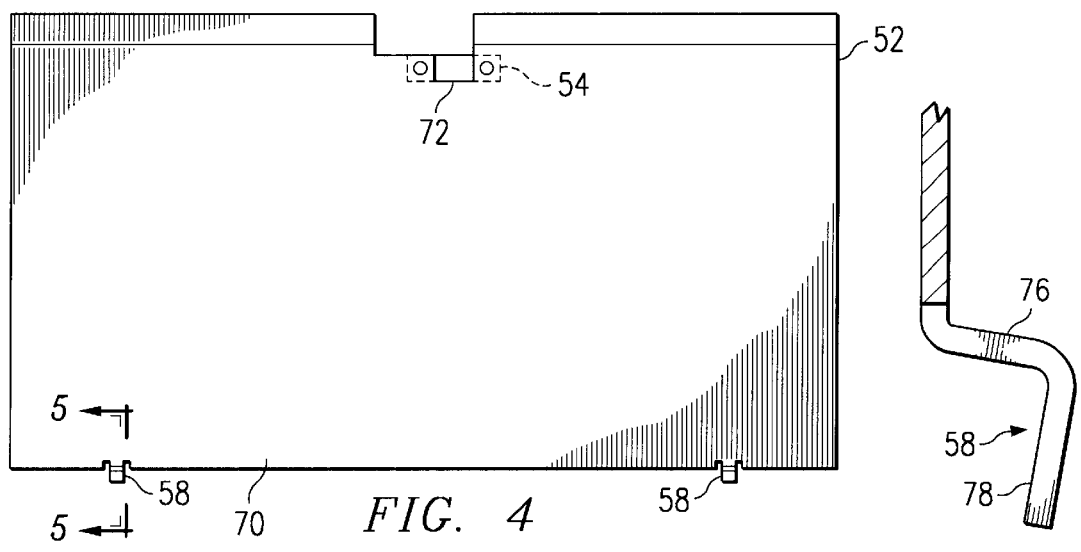
FIG. 4
FIG. 5
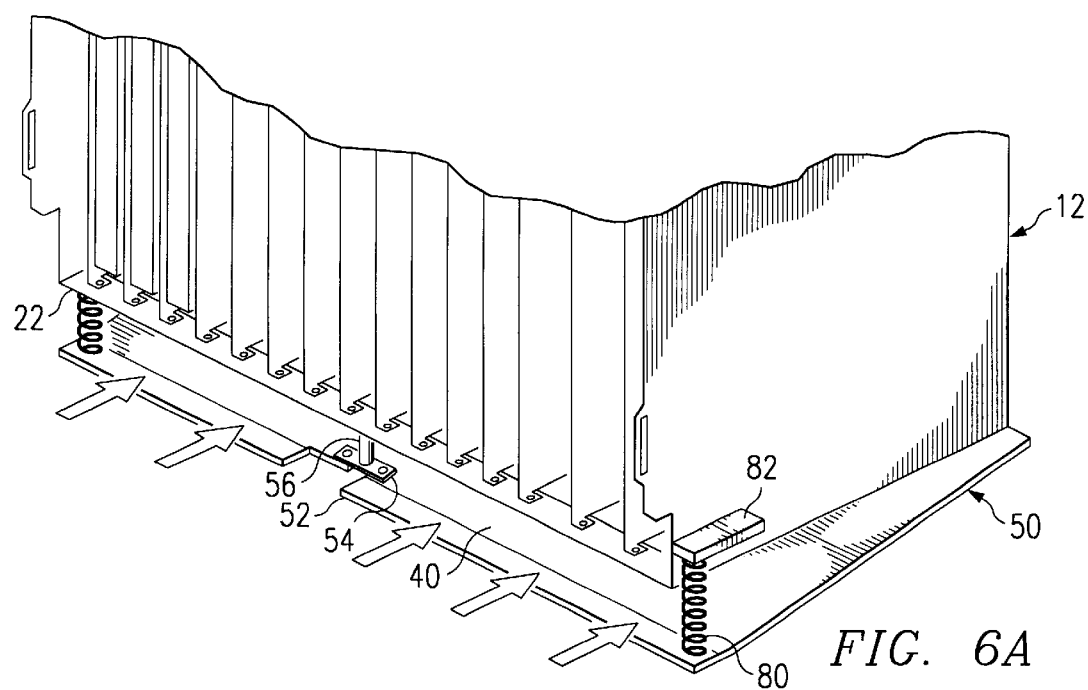
FIG. 6A
FIG. 6B

CARD SHELF FIRE SUPPRESSION SYSTEM AND METHOD

TECHNICAL FIELD OF THE INVENTION

This invention relates in general to the field of modular electronic systems and, more particularly, to a card shelf fire suppression system and method.

BACKGROUND OF THE INVENTION

Modular electronic systems are generally configured as card shelf assemblies to optimize space efficiency within a central office or other similar facilities. Card shelves include individual plug-in electronic module cards having different functions that communicate across a backplane. The electronic cards may have different thicknesses depending upon the amount of electronic circuitry contained in each electronic card. The electronic cards may also have flanges on the top or bottom which fit into grooves into the card shelf for sliding the electronic cards into the card shelf and plugging the electronic cards into connectors located in the backplane of the card shelf.

The card shelf may also include an open or perforated top and bottom portion to allow thermal energy generated by the electronic cards during operation to escape the card shelf. The card shelf may also include a fan assembly for directing airflow through the card shelf to dissipate thermal energy generated by the electronic cards during operation.

Known card shelves present certain drawbacks. For example, to maximize space within a card shelf, electronic cards are placed in close proximity to one another. As a result, dissipation of thermal energy generated by the electronic cards during operation may be difficult or inadequate to maintain proper operation of the electronic cards. Additionally, the thermal energy generated by the electronic cards may cause a fire to ignite within the card shelf, thereby damaging one or more of the electronic cards. Including fan assemblies in known card shelves also presents certain drawbacks. For example, airflow generated by the fan assembly may cause acceleration and/or propagation of a fire ignited within the card shelf.

SUMMARY OF THE INVENTION

The present invention provides a card shelf fire suppression system and method that addresses shortcomings of prior systems and methods. In particular, a passively activated damper system is provided that substantially suppresses a fire that may ignite within the card shelf.

According to one embodiment of the present invention, a card shelf includes a backplane and a plurality of slots each configured to receive an electronic card adapted for engagement with the backplane. The system also includes an airflow path for providing airflow adjacent the electronic card for dissipating thermal energy generated by the electronic card. The system further includes a damper system disposed proximate the slots and operable to passively activate in response to a predetermined temperature condition to substantially prevent airflow through the slots.

According to another embodiment of the present invention, a method for passively controlling airflow to an electronic card in a card shelf includes providing a damper disposed proximate the electronic card. The damper includes a thermal fuse being responsive to a predetermined temperature condition. The method also includes supporting the damper proximate the thermal fuse in a first position relative to the electronic card such that airflow passes adjacent the electronic card. The method further includes passively activating the damper in response to the predetermined temperature condition such that the thermal fuse deforms to cause the damper to travel from the first position to a second position relative to the electronic card to substantially prevent airflow adjacent the electronic card.

Technical advantages of the present invention include providing an improved method and system for passively suppressing a fire that may ignite within a card shelf. In particular, a damper system is provided to passively activate in response to a predetermined temperature condition. The predetermined temperature condition may be selected such that an elevated temperature condition generally associated with a fire within the card shelf causes passive activation of the damper system. According to one embodiment of the present invention, the damper system includes a thermal fuse coupled to a damper. The damper is supported at the location of the thermal fuse in a position to accommodate airflow through the card shelf during normal operating conditions. In response to an elevated temperature condition that may be indicative of a fire within the card shelf, the thermal fuse deforms, thereby causing the damper to become unsupported and travel to a closed position to substantially prevent airflow adjacent the electronic cards. Thus, the system is passively activated to substantially suppress and/or contain a fire ignited within the card shelf.

Another technical advantage of the present invention includes providing a card shelf fire suppression system and method that is generally inexpensive and less susceptible to electrical and/or mechanical failure. For example, according to one embodiment of the present invention, a damper is supported at a location of a thermal fuse such that deformation of the thermal fuse in response to an elevated temperature condition causes the damper to become unsupported and travel to a closed position, thereby substantially preventing airflow adjacent the electronic card. In this embodiment, gravitational forces act on the damper to move the damper from an open position to the closed position. Thus, the present invention is less susceptible to electrical and/or mechanical failure that may be associated with electrically-actuated fire damper systems.

Other technical advantages of the present invention will be readily apparent to one skilled in the art from the following figures, descriptions and claims.

BRIEF DESCRIPTION OF THE DRAWINGS

For a more complete understanding of the present invention and the advantages thereof, reference is now made to the following descriptions taken in connection with the accompanying drawings in which:

FIG. 1 is a schematic diagram illustrating a card shelf fire suppression system in accordance with one embodiment of the present invention;

FIGS. 2A and 2B are schematic diagrams illustrating a side view of the card shelf of FIG. 1 in accordance with an embodiment of the present invention;

FIGS. 3A and 3B are schematic diagrams illustrating a side view of the card shelf of FIG. 1 in accordance with an alternate embodiment of the present invention;

FIG. 4 is a schematic diagram illustrating a damper and a thermal fuse for the card shelf of FIG. 1 in accordance with an embodiment of the present invention;

FIG. 5 is a schematic diagram illustrating a side view along the axis identified as lines 5—5 of the damper of FIG. 4 in accordance with an embodiment of the present invention.

FIGS. 6A and 6B are schematic diagrams illustrating a card shelf fire suppression system in accordance with an alternate embodiment of the present invention.

DETAILED DESCRIPTION OF THE PREFERRED EMBODIMENTS

FIG. 1 illustrates a card shelf assembly 10 in accordance with an embodiment of the present invention. Card shelf assembly 10 includes a card shelf 12 and electronic cards 14. Card shelf 12 further includes side members 16 and 18, a top member 20, and a bottom member 22. Top member 20 and bottom member 22 include perforations 24 and 26, respectively, to allow airflow to pass through card shelf 12 to dissipate thermal energy generated by electronic cards 14.

Dividers 28 are positioned within card shelf 12 to form slots 30 for receiving electronic cards 14 within card shelf 12. For example, dividers 28 may be positioned to align a connector (not explicitly shown) on a back of an electronic card 14 with a corresponding connector (not explicitly shown) located on a backplane 32 of card shelf 12. Thus, in operation, electronic cards 14 may be slid into a slot 30 between or formed by dividers 28 and plugged into a corresponding connector on backplane 32.

Card shelf 12 also includes an airflow inlet 40 and an airflow outlet 42 for providing an airflow path through card shelf 12 and adjacent electronic cards 14 to dissipate thermal energy generated by electronic cards 14. For example, thermal energy generated by electronic cards 14 travels upwardly, thereby drawing airflow into inlet 40 and upwardly through card shelf 12 and adjacent electronic cards 14. The airflow is then exhausted through outlet 42. Thus, electronic cards 14 are cooled by a passive airflow through card shelf 12. However, other suitable methods or devices may also be used to provide airflow through card shelf 12 for dissipating thermal energy generated by electronic cards 14.

Inlet 40 may be configured by disposing a ramp member 44 at an angular position relative to bottom member 22 to form an opening 46 for receiving airflow into card shelf 12. For example, ramp member 44 may be positioned at a downwardly disposed angle relative to card shelf 12 to allow sufficient airflow through inlet 40 to dissipate thermal energy generated by electronic cards 14. In the embodiment illustrated in FIG. 1, opening 46 is disposed in a forwardly facing direction relative to card shelf 12. However, inlet 40 may be disposed at other suitable locations relative to card shelf 12 to accommodate airflow through card shelf 12 and adjacent electronic cards 14.

Card shelf 12 also includes a damper system 50 for passively suppressing and/or containing a fire that may ignite within card shelf 12. Damper system 50 passively activates in response to a predetermined elevated temperature condition generally indicating the ignition of a fire within card shelf 12 to suppress and/or contain the fire. In the embodiment illustrated in FIG. 1, damper system 50 is disposed upwardly from electronic cards 14. However, damper system 50 may also be located at other suitable locations relative to card shelf 12.

In the embodiment illustrated in FIG. 1, damper system 50 includes a damper 52, a thermal fuse 54, and a support 56. Damper 52 is coupled to card shelf 12 in an open or elevated position relative to card shelf 12 to accommodate airflow through card shelf 12 and outlet 42. Support 56 is positioned between card shelf 12 and damper 52 to support damper 52 in the elevated or open position to accommodate airflow through card shelf 12 and outlet 42. Support 56 may be constructed having a variety of lengths to accommodate a variety of angular positions of damper 52 relative to card shelf 12 to accommodate a sufficient volume of airflow through card shelf 12 to dissipate thermal energy generated by electronic cards 14. Support 56 may be coupled to top member 20 in a position to support damper 52 in the open position; however, support 56 may be coupled to other suitable locations of card shelf 12 to support damper 52 in the open position.

Damper 52 is coupled to card shelf 12 to accommodate travel of damper 52 from the open or elevated position to a closed position relative to card shelf 12. For example, in the embodiment illustrated in FIG. 1, damper 52 comprises a plurality of legs 58 extending through a plurality of corresponding openings 60 formed in a forward-facing support 62 of card shelf 12. In operation, legs 58 extend through openings 60 to prevent translational movement of damper 52 relative to card shelf 12 while accommodating rotational movement of damper 52 relative to card shelf 12.

Thermal fuse 54 is coupled to damper 52 at a location corresponding to a location of support 56 such that support 56 is disposed between thermal fuse 54 and card shelf 12. Thermal fuse 54 is selected and configured such that thermal fuse 54 is deformable in response to a predetermined temperature condition. For example, thermal fuse 54 may be selected such that thermal fuse 54 deforms in response to a predetermined temperature condition generally indicating that a fire has ignited within card shelf 12. The predetermined temperature condition may be selected from an elevated temperature range generally above the temperature conditions within card shelf 12 during normal operation of electronic cards 14 such that the predetermined temperature condition generally corresponds to a fire within card shelf 12. In one embodiment of the present invention, thermal fuse 54 may comprise an indium alloy available from Indium Corporation as part number Indalloy 255 and having a deformation temperature value of approximately 255 degrees Fahrenheit (124 degrees Celsius); however, other suitable materials and temperature deformation values may be used for constructing thermal fuse 54.

In operation, damper system 50 passively activates in response to a predetermined temperature condition to substantially prevent airflow through card shelf 12 to suppress and/or contain any fire ignited within card shelf 12. For example, in response to an elevated temperature condition, thermal fuse 54 deforms, thereby causing damper 52 to be unsupported by support 56. Thus, as thermal fuse 54 deforms, gravitational forces acting on damper 52 cause damper 52 to travel downwardly toward card shelf 12 to a generally closed position relative to card shelf 12, thereby substantially preventing airflow through card shelf 12. Therefore, damper system 50 passively activates to substantially prevent airflow through card shelf 12 and adjacent electronic cards 14, thereby substantially preventing an oxygen supply to a fire within card shelf 12.

FIGS. 2A and 2B are schematic diagrams illustrating a side view of system 10 in accordance with an embodiment of the present invention. Referring to FIG. 2A, damper system 50 is illustrated in an elevated or open position relative to card shelf 12 to accommodate airflow through card shelf 12 from inlet 40 to outlet 42. Support 56 is disposed proximate to an edge of card shelf 12 and in line with thermal fuse 54 to support damper 52 in the open position. Support 56 may be coupled to top member 20 using a fastener (not explicitly shown) extending through top member 20 and into an internally threaded opening (not explicitly shown) within support 56. However, other suitable methods or devices may be used to secure and position support 56 between card shelf 12 and thermal fuse 54.

Referring to FIG. 2B, damper system 50 is illustrated in a closed position relative to card shelf 12, thereby substantially preventing airflow through card shelf 12. As described above, in response to an elevated temperature condition within card shelf 12, thermal fuse 54 deforms, thereby allowing damper 52 to become unsupported. As thermal fuse 54 deforms, gravitational forces cause damper 52 to travel downwardly from the open position to a substantially closed position relative to card shelf 12 to substantially prevent airflow through card shelf 12. Legs 58 extending through openings 60 in support 62 are used to rotationally couple damper 52 to card shelf 12 to accommodate rotational movement of damper 52 relative to card shelf 12.

FIGS. 3A and 3B are schematic diagrams illustrating system 10 in accordance with an alternate embodiment of the present invention. As illustrated in FIGS. 3A and 3B, damper 52 is rotationally coupled to card shelf 12 using hinges 64 to accommodate rotational movement of damper 52 relative to card shelf 12. However, other suitable methods or devices may be used to couple damper 52 to card shelf 12. In operation, as described above, in response to an elevated temperature condition, thermal fuse 54 deforms causing damper 52 to become unsupported by support 56, thereby allowing damper 52 to rotate downwardly from an open or elevated position, as illustrated in FIG. 3A, to a substantially closed position, as illustrated in FIG. 3B.

FIG. 4 is a schematic diagram illustrating damper 52 and thermal fuse 54 in accordance with an embodiment of the present invention. In this embodiment, damper 52 comprises a plate 70 having a generally planar configuration to accommodate a corresponding generally planar configuration of the upwardly disposed portion of card shelf 12. However, damper 52 may be constructed having other suitable geometric configurations for engaging a corresponding geometric configuration of card shelf 12.

As illustrated in FIG. 4, damper 52 includes an opening or removed portion 72 located corresponding to an attachment location of support 56 on card shelf 12. Thermal fuse 54 is coupled to damper 52 in a position corresponding to opening 72 such that support 56 supports damper 52 in the open position by contacting thermal fuse 54. Thus, deformation of thermal fuse 54 causes support 56 to extend through opening 72, thereby accommodating movement of damper 52 to the closed position. Thermal fuse 54 may be coupled to damper 52 using fasteners; however, other suitable methods or devices may be used to couple thermal fuse 54 to damper 52.

FIG. 5 is a diagram illustrating a section view of damper 52 taken along the line 5—5 of FIG. 4. In the embodiment illustrated in FIGS. 4 and 5, damper 52 includes legs 58 extending downwardly from plate 70. As described above, legs 58 are formed to accommodate attachment of damper 52 to card shelf 12 while accommodating movement of damper 52 from an open to a closed position. For example, referring to FIG. 5, each leg 58 may include a downwardly extending portion 76 and an outwardly extending portion 78. Portions 76 and 78 may be formed having an angular relationship to each other such that coupling portion 78 to card shelf 12 causes damper 52 to be positioned in the open position relative to card shelf 12. For example, as best illustrated in FIGS. 1, 2A and 2B, portions 78 extends through openings 60 in support 62 to position damper 52 in an elevated position while accommodating movement of damper 52 when damper 52 becomes unsupported by support 56. However, other suitable methods or devices may be used to secure damper 52 to card shelf 12.

FIG. 6A is a schematic diagram illustrating an alternate embodiment of system 10, and FIG. 6B is a side view of system 10 illustrated in FIG. 6A. In this embodiment, damper system 50 is disposed downwardly from electronic cards 14 at a position below card shelf 12. Damper system 50 may be positioned below card shelf 12 as illustrated in FIGS. 6A and 6B in combination with a damper assembly 50 disposed above card shelf 12 as illustrated in FIG. 1, or damper system 50 may be disposed at only a single location relative to card shelf 12. For example, disposing a damper system 50 both above and below card shelf 12 provides redundant fire suppression capabilities. Thus, the present invention provides greater flexibility than prior fire suppression systems and methods.

As illustrated in FIGS. 6A and 6B, damper system 50 includes damper 52, thermal fuse 54, and support 56. Support 56 is positioned between thermal fuse 54 and card shelf 12 and supports damper 52 in an open position relative to card shelf 12 to form airflow inlet 40. Support 56 may be coupled to a portion of bottom member 22 using fasteners (not explicitly shown); however, other suitable methods or devices maybe used to position support 56 between thermal fuse 54 and card shelf 12.

In the embodiment illustrated in FIGS. 6A and 6B, damper system 50 also includes one or more springs 80 coupled to damper 52 and an outwardly extending support 82 of card shelf 12. In operation, support 56 is positioned between thermal fuse 54 and card shelf 12 to support damper 52 in an extended or open position relative to card shelf 12 to accommodate airflow into card shelf 12 and adjacent electronic cards 14. Springs 80 are coupled to damper 52 and supports 82 in an extended position such that a retracting force is stored in springs 80 to maintain contact between thermal fuse 54 and support 56.

In response to a predetermined temperature condition, thermal fuse 54 deforms, thereby causing damper 52 to become unsupported by support 56. As thermal fuse 54 deforms, springs 80 retract and cause damper 52 to travel from the open position to a closed position relative to card shelf 12, thereby substantially preventing airflow from entering card shelf 12 through inlet 40. Thus, damper system 50 passively activates in response to a predetermined temperature condition to substantially suppress and/or contain a fire that may have ignited within card shelf 12. In this embodiment, springs 80 are used to provide a retracting force to cause movement of damper 52 as damper 52 becomes unsupported by support 56 however, other suitable methods or devices may be used to provide upwardly directed movement of damper 52 to a closed position relative to card shelf 12.

Although the present invention and its advantages have been described in detail, it should be understood that various changes, substitutions, and alterations can be made therein without departing from the spirit and scope of the present invention as defined by the appended claims.

What is claimed is:

1. A card shelf comprising:
   a backplane;
   a plurality of slots each configured to receive an electronic card adapted for engagement with the backplane;
   an airflow path for providing airflow adjacent the electronic card for dissipating thermal energy generated by the electronic card; and
   a damper system disposed proximate the slots and comprising a damper and a thermal fuse coupled to the damper, the thermal fuse being responsive to a predetermined temperature condition to cause the thermal fuse to deform such that the damper moves to passively activate to substantially prevent airflow through the slots and adjacent the electronic card.

2. The card shelf of claim 1, wherein the damper system is operable to passively activate in response to a predetermined temperature condition.

3. The card shelf of claim 1, wherein the damper system is disposed upwardly from the plurality of slots.

4. The card shelf of claim 1, wherein the damper system further comprises a support coupled to the thermal fuse and operable to support the damper in a first position relative to the slots, the thermal fuse being responsive to a predetermined temperature condition to cause the thermal fuse to deform such that the damper travels from the first position to a second position relative to the slots.

5. The card shelf of claim 1, further comprising:
a plurality of side members disposed proximate the backplane; and
a top member disposed between the side members and upwardly from the slots; the damper coupled to the top member; and wherein the damper system further comprises:
a support disposed between the top member and the thermal fuse and operable to support the damper in a first position relative to the top member, the thermal fuse being responsive to a predetermined temperature condition to cause the thermal fuse to deform such that the damper travels from the first position to a second position relative to the top member.

6. A card shelf comprising:
a backplane;
a plurality of side members disposed proximate to the backplane;
a plurality of slots each configured to receive an electronic card adapted for engagement with the backplane;
a top member disposed between the side members and upwardly from the slots;
an airflow path for providing airflow adjacent the electronic card for dissipating thermal energy generated by the electronic card; and
a damper system disposed proximate the slots and operable to passively activate to substantially prevent airflow through the slots and adjacent the electronic card; the damper system comprising:
a damper rotatably coupled to the top member
a thermal fuse coupled to the damper; and
a support disposed between the top member and the thermal fuse and operable to support the damper in a first position relative to the top member, the thermal fuse being responsive to a predetermined temperature condition to cause the thermal fuse to deform such that the damper plate rotates from a first position to a second position relative to the top member.

7. A card shelf comprising:
a backplane;
a plurality of slots each configured to receive an electronic card adapted for engagement with the backplane;
an airflow path for providing airflow adjacent the electronic card for dissipating thermal energy generated by the electronic card;
a damper system disposed proximate the slots and comprising a damper and a thermal fuse coupled to the damper, the thermal fuse being responsive to a predetermined temperature condition to cause the thermal fuse to deform such that the damper moves to passively activate to substantially prevent airflow through the slots and adjacent the electronic card;
a plurality of side members disposed proximate the backplane; and
a bottom member disposed between the side members and downwardly from the slots; and wherein the damper system comprises:
a damper coupled to the bottom member;
a thermal fuse coupled to the damper;
a spring coupled to the damper and one of the side members; and
a support disposed between the bottom member and the thermal fuse and operable to support the damper in a first position relative to the bottom member, the thermal fuse being responsive to a predetermined temperature condition to cause the thermal fuse to deform such that the spring causes the damper to travel from the first position to a second position relative to the bottom member.

8. The card shelf of claim 1, further comprising a top member disposed upwardly from the slots and coupled between a plurality of side members, and wherein the damper system further comprises:
a support disposed between the thermal fuse and the top member and operable to support the damper at a first position relative to the top member, the thermal fuse being responsive to a predetermined temperature condition to cause the thermal fuse to deform such that the damper travels from the first position to a second position relative to the top member.

9. A passively activated damper system for a card shelf, comprising:
a damper coupled to a card shelf;
a thermal fuse coupled to the damper; and
a support coupled to the thermal fuse and operable to support the damper in a first position relative to the card shelf, the thermal fuse being responsive to a predetermined temperature condition to cause the thermal fuse to deform such that the damper travels from the first position to a second position relative to the card shelf.

10. The system of claim 9, wherein the support is coupled to the card shelf.

11. The system of claim 9, wherein the damper is rotatably coupled to the card shelf such that the damper rotates from the first position to the second position.

12. The system of claim 9, wherein the damper is disposed on an upwardly disposed portion of the card shelf such that gravitational forces cause the damper to travel from the first position to the second position.

13. The system of claim 9, further comprising a spring coupled to the damper and the card shelf, the spring operable to retract to cause the damper to travel from the first position to the second position.

14. The system of claim 13, wherein the damper is disposed on a downwardly disposed portion of the card shelf.

15. The system of claim 9, wherein the damper comprises a damper plate having an opening, and wherein the thermal fuse is disposed over the opening.

16. The system of claim 15, wherein the opening is disposed along an edge of the damper plate.

17. A method for passively controlling air flow to an electronic card in a card shelf, comprising:
providing a damper operable to control airflow to the electronic card and a thermal fuse coupled to the damper, the thermal fuse being responsive to a predetermined temperature condition;

supporting the damper at a location aligned with the thermal fuse in a first position relative to the electronic card such that the air flow passes adjacent the electronic card; and passively activating the damper in response to the predetermined temperature condition such that the thermal fusse deforms to cause the damper to travel from the first position to a second position relative to the electronic card to substantially prevent air flow adjacent the electronic card.

18. The method of claim 17, wherein supporting the damper comprises supporting the damper with a support coupled to the card shelf and aligned with the thermal fuse.

19. The method of claim 17, wherein providing the damper comprises providing a damper plate rotatably coupled to an upwardly disposed portion of the card shelf such that gravitational forces cause the damper plate to travel from the first position to the second position.

20. The method of claim 17, further comprising providing a spring coupled between the damper and the card shelf such that retraction of the spring causes the damper to travel from the first position to the second position.

21. The method of claim 20, wherein providing the damper comprises providing the damper coupled to a downwardly disposed portion of the card shelf, and wherein the spring retracts to cause the damper to travel upwardly from the first position to the second position.

22. A card shelf comprising:

a backplane;

a plurality slots configured to receive an electronic card adapted for engagement with the backplane;

an inlet operable to receive and direct an air flow adjacent the electronic card;

an outlet operable to direct the air flow away from the electronic card; and a damper system comprising a damper and a thermal fuse coupled to the damper, the thermal fuse being responsive to a predetermined temperature condition to cause the thermal fuse to deform such that the damper moves to passively activate to substantially prevent the air flow adjacent the electronic card.

23. The card shelf of claim 22, wherein the damper system is operable to travel from an open position relative to the outlet to a closed position relative to the outlet to substantially prevent air flow adjacent the electronic card.

24. The card shelf of claim 22, wherein the damper system further comprises a support coupled to the thermal fuse and operable to support the damper in a first position relative to the outlet, the thermal fuse being responsive to the predetermined temperature condition to cause the thermal fuse to deform such that the damper travels from the first position to a second position relative to the outlet.

25. A card shelf comprising:

a backplane;

a plurality slots configured to receive an electronic card adapted for engagement with the backplane;

an inlet operable to receive and direct an air flow adjacent the electronic card;

an outlet operable to direct the air flow away from the electronic card;

a damper system comprising a damper and a thermal fuse coupled to the damper, the thermal fuse being responsive to a predetermined temperature condition to cause the thermal fuse to deform such that the damper moves to passively activate to substantially prevent the air flow adjacent the electronic card;

the damper disposed proximate the inlet;

the thermal fuse coupled to the damper;

a spring having a first end coupled to the damper and a second end coupled to a portion of the card shelf adjacent the inlet; and a support coupled to the thermal fuse and operable to support the damper in a first position relative to the inlet, the thermal fuse being responsive to the predetermined temperature condition to cause the thermal fuse to deform such that the spring retracts to cause the damper to travel from the first position to a second position relative to the inlet to substantially prevent air flow adjacent the electronic card.

26. The card shelf of claim 22, further comprising a top member having a plurality of holes disposed upwardly from the slots, the damper rotatably coupled to the top member; and wherein the damper system further comprises a support disposed between the thermal fuse and the top member, the support operable to support the damper in an open position, the thermal fuse being responsive to the predetermined temperature condition to cause the thermal fuse to deform such that the damper travels from the open position to a closed to substantially prevent air flow adjacent the electronic card.

* * * * *